United States Patent [19]

Sugihara et al.

[11] Patent Number: 4,968,664

[45] Date of Patent: Nov. 6, 1990

[54] SINGLE-CRYSTAL WAFER HAVING A SUPERCONDUCTIVE CERAMIC THIN FILM FORMED THEREON

[75] Inventors: Tadashi Sugihara; Takuo Takeshita, both of Ohmiya, Japan

[73] Assignee: Mitsubishi Metal Corporation, Tokyo, Japan

[21] Appl. No.: 391,422

[22] Filed: Aug. 9, 1989

[51] Int. Cl.$^5$ .............................................. B32B 9/00
[52] U.S. Cl. ........................................ 505/1; 505/701; 505/702; 505/703; 505/704; 428/411.1; 428/688; 428/699; 428/700; 428/930
[58] Field of Search ........................... 505/1, 701-704; 428/411.1, 688, 699, 700, 930

[56] References Cited

PUBLICATIONS

CA 111 (26):245688u, SC Properties of BaYCuO Thin Films, Yamaguchi et al., 1989.
CA 111 (14):125175c, SC on Cheap Substrate with Ceramic Interlayer, Takano et al., 2-28-89.

*Primary Examiner*—Patrick Ryan
*Attorney, Agent, or Firm*—Frishauf, Holtz, Goodman & Woodward

[57] ABSTRACT

A superconductive ceramic thin film-formed single-crystal wafer comprising a single-crystal wafer, an intermediate ceramic thin film formed on a surface of the single-crystal wafer, and a superconductive ceramic thin film formed on the intermediate ceramic thin film. The intermediate ceramic thin film comprises, as a main phase, a crystalline phase having a composition by atomic ratio of $Bi_2Sr_2Ca_xO_y$ (provided that x: 1 to 2; and y: 6 to 7), and the superconductive ceramic thin film comprises, as a main phase, a crystalline phase having a composition by atomic ratio selected from the group consisting of $Bi_2Sr_2Ca_1Cu_2O_8$ and $Bi_2Sr_2Ca_2Cu_3O_{10}$. Alternatively, the intermediate ceramic thin film comprises, as a main phase, a crystalline phase having a composition by atomic ratio selected from the group consisting of $Tl_1Ba_2Ca_sO_t$ (provided that s: 1 to 2; and t: 4.5 to 5.5) and $Tl_2Ba_2Ca_vO_w$ (provided that v: 1 to 3; and w: 6 to 8), and the superconductive ceramic thin film comprises, as a main phase, a crystalline phase having a composition by atomic ratio selected from the group consisting of $Tl_2Ba_2Ca_1Cu_2O_8$, $Tl_1Ba_2Ca_2Cu_3O_{10}$, $Tl_1Ba_2Ca_1Cu_2O_7$, $Tl_1Ba_2Ca_2Cu_3O_9$, and $Tl_1Ba_2Ca_3Cu_4O_{11}$.

18 Claims, No Drawings

SINGLE-CRYSTAL WAFER HAVING A SUPERCONDUCTIVE CERAMIC THIN FILM FORMED THEREON

BACKGROUND OF THE INVENTION

This invention relates to a single-crystal wafer having a superconductive ceramic thin film formed thereon for semiconductor devices, such as LSI's and Josephson devices.

Conventionally, attempts have been made to use as a material for semiconductor devices, such as LSI's and Josephson devices, a single-crystal wafer having a superconductive ceramic thin film formed thereon (hereinafter referred to as "a superconductive thin film-formed wafer"), which is prepared by forming a superconductive ceramic thin film (hereinafter referred to as "a superconductive thin film") containing as a main phase a crystalline phase having a composition by atomic ratio selected from the group consisting of $Bi_2Sr_2Ca_1Cu_2O_8$ and $Bi_2Sr_2Ca_2Cu_3O_{10}$ on a surface of a single-crystal wafer formed of Si, Ga—As, or the like by sputtering or PVD (physical vapor deposition) by the use of a target having a composition by atomic ratio selected from the group consisting of $Bi_2Sr_2Ca_1Cu_3O_{10}$ and $Bi_2Sr_2Ca_2Cu_4O_{12}$, and then subjecting the resulting wafer to heat treatment under an oxygen atmosphere at a temperature of 890° C.±2° C. over 20 to 50 hours for crystalline orientation of the thin film.

Also, attempts have been made to use as a material for semiconductor devices, such as LSI's and Josephson devices, a superconductive thin film-formed wafer, which is prepared by forming a superconductive thin film containing as a main phase a crystalline phase having a composition by atomic ratio selected from the group consisting of $Tl_2Ba_2Ca_1Cu_2O_8$, $Tl_2Ba_2Ca_2Cu_3O_{10}$, $Tl_1Ba_2Ca_1Cu_2O_7$, $Tl_1Ba_2Ca_2Cu_3O_9$, and $Tl_1Ba_2Ca_3Cu_4O_{11}$ on a surface of a single-crystal wafer formed of Si, Ga—As, or the like by sputtering or PVD (physical vapor deposition) by the use of a target having a composition by atomic ratio selected from the group consisting of $Tl_2Ba_2Ca_1Cu_3O_{10}$, $Tl_2Ba_2Ca_2Cu_4O_{12}$, $Tl_1Ba_2Ca_1Cu_3O_8$, $Tl_1Ba_2Ca_2Cu_4O_{10}$, and $Tl_1Ba_2Ca_3Cu_5O_{12}$, and then subjecting the resulting wafer to heat treatment in an infrared oven under an atmosphere containing Tl vapor at a temperature of 900° C.±2° C. over 10 to 30 minutes, followed by quenching, for crystalline orientation of the thin film.

In the meanwhile, there is an increasing demand for a superconductive thin film to be formed on a single-crystal wafer, which has a still higher critical temperature (Tc) at which the film shows superconductivity, in order to cope with recent higher performance and increased wiring density of semiconductor devices.

SUMMARY OF THE INVENTION

It is the object of the invention to provide a superconductive thin film-formed wafer which has a superconductive thin film with a higher critical temperature (Tc).

To attain the above object, the present invention provides a superconductive ceramic thin film-formed single-crystal wafer comprising:

a single-crystal wafer;
an intermediate ceramic thin film formed on a surface of the single-crystal wafer; and
a superconductive ceramic thin film formed on the intermediate ceramic thin film.

Preferably, the intermediate ceramic thin film comprises, as a main phase, a crystalline phase having a composition by atomic ratio of $$Bi_2Sr_2Ca_xO_y$$

(provided that x: 1 to 2; and y: 6 to 7), and the superconductive ceramic thin film comprises, as a main phase, a crystalline phase having a composition by atomic ratio selected from the group consisting of $$Bi_2Sr_2Ca_1Cu_2O_8 \text{ and}$$

$$Bi_2Sr_2Ca_2Cu_3O_{10}.$$

Alternatively, the intermediate ceramic thin film comprises, as a main phase, a crystalline phase having a composition by atomic ratio selected from the group consisting of $$Tl_1Ba_2Ca_sO_t$$

(provided that s: 1 to 2; and t: 4.5 to 5.5) and $$Tl_2Ba_2Ca_vO_w$$

(provided that v: 1 to 3; and w: 6 to 8), and the superconductive ceramic thin film comprises, as a main phase, a crystalline phase having a composition by atomic ratio selected from the group consisting of $$Tl_2Ba_2Ca_1Cu_2O_8,$$

$$Tl_2Ba_2Ca_2Cu_3O_{10},$$

$$Tl_1Ba_2Ca_1Cu_2O_7,$$

$$Tl_1Ba_2Ca_2Cu_3O_9, \text{ and}$$

$$Tl_1Ba_2Ca_3Cu_4O_{11}.$$

Also preferably, the single-crystal wafer comprises Si.

Alternatively, the single-crystal wafer comprises Ga—As.

Preferably, the intermediate ceramic thin film has a thickness within a range of 500 to 2000 A.

DETAILED DESCRIPTION

Under the aforestated circumstances, we have made studies to develop a superconductive thin film for single-crystal wafers, which has a higher critical temperature, and reached the following findings:

If a ceramic thin film containing as a main phase a crystalline phase having a composition by atomic ratio of $Bi_2Sr_2Ca_xO_y$ (provided that x: 1 to 2; and y: 6 to 7), preferably having a thickness of 500 to 2000 Å, is formed as an intermediate layer on a surface of a single-crystal wafer formed of Si, Ga—As, or the like before forming the first-mentioned superconductive thin film thereon, the superconductive thin film of the superconductive thin film-formed wafer after being subjected to heat treament for crystalline orientation of the thin film has a still higher critical temperature.

If a ceramic thin film containing as a main phase a crystalline phase having a composition by atomic ratio selected from the group consisting of $Tl_1Ba_2Ca_sO_t$ (provided that s: 1 to 2; and t: 4.5 to 5.5) and $Tl_2Ba_2Ca_vO_w$ (provided that v: 1 to 3; and w: 6 to 8), preferably having a thickness of 500 to 2000 Å, is formed as an intermediate layer on a surface of a single-crystal wafer formed of Si, Ga—As, or the like before forming the second-mentioned superconductive thin film thereon, the superconductive thin film of the superconductive thin film-formed wafer after being subjected to heat treatment for crystalline orientation of the thin film also has a still higher critical temperature.

The present invention is based upon the above findings, and provides a superconductive thin film-formed wafer having the aforestated structure.

The compositions of the crystalline phases which each form the main phase of the intermediate thin film of the superconductive thin film-formed wafer according to the invention have been experimentally determined. As clearly shown by comparative examples in Tables 1 and 2 set forth hereinafter, if the main phase is a crystalline phase having a composition outside the above-described range, the wafer does not exhibit a desirably high critical temperature.

Further, the thickness of the intermediate thin film of the superconductive thin film-formed wafer according to the invention is preferably 500 to 2000 Å, because if the thickness is smaller than 500 Å, the critical temperature cannot be increased to a desired level, whereas if the thickness is greater than 2000 Å, the critical temperature can be increased to a desired level, but no greater effect can be obtained by increasing the thickness above 2000 Å. Therefore, it is not economical to form the thin film having a greater thickness.

Examples of the superconductive thin film-formed wafer according to the invention will be described in detail below.

EXAMPLE 1

As a substrate, a single-crystal wafer of Si having a diameter of 50.0 mm and a thickness of 0.35 mm was prepared. The substrate was mounted on a conventional sputtering apparatus. Sputtering was carried out by the use of a target for formation of an intermediate thin film, which has a composition shown in Table 1, a diameter of 127 mm and a thickness of 6 mm, under the following conditions:

Radio Frequency Power (13.56 MHz): 200 W
Degree of Vacuum: 20 m torr
Atmosphere: $O_2/(Ar+O_2)=1/5$ (v/v)
Distance between Substrate and Target: 70 mm
Substrate Temperature: 680° C.

Thus, an intermediate thin film having substantially the same composition as the target and an average thickness shown in Table 1 was formed on a surface of the substrate. Then, sputtering was carried out by the use of a target for formation of a superconductive thin film, which has a composition shown in Table 1, a diameter of 127 mm and a thickness of 6 mm, under the following conditions:

Radio Frequency Power (13.56 MHz): 200 W
Degree of Vacuum: 10 m torr
Atmosphere: $O_2/(Ar+O_2)=1/10$ (v/v)
Distance between Substrate and Target: 70 mm
Substrate Temperature: 720° C.

Thus, a superconductive thin film in which the main crystalline phase has a composition, a content, and an average thickness shown in Table 1 was formed on the intermediate thin film. The resulting film-formed wafer was further subjected to heat treatment

TABLE 1

| SPECIMEN | COMPOSITION OF TARGET FOR INTERMEDIATE THIN FILM (ATOMIC RATIO) | AVERAGE THICKNESS OF INTERMEDIATE THIN FILM (Å) | COMPOSITION OF TARGET FOR SUPERCONDUCTIVE THIN FILM (ATOMIC RATIO) | SUPERCONDUCTIVE THIN FILM | | | |
|---|---|---|---|---|---|---|---|
| | | | | COMPOSITION OF MAIN CRYSTALLINE PHASE (ATOMIC RATIO) | CONTENT OF MAIN CRYSTALLINE PHASE (% BY VOLUME) | AVERAGE THICKNESS (μm) | CRITICAL TEMPERATURE (Tc) |
| SUPERCONDUCTIVE THIN FILM-FORMED WAFERS ACCORDING TO PRESENT INVENTION | | | | | | | |
| 1 | $Bi_2Sr_2Ca_1O_6$ | 500 | $Bi_2Sr_2Ca_1Cu_3O_{10}$ | $Bi_2Sr_2Ca_1Cu_2O_8$ | 98 | 1.0 | 82 |
| 2 | $Bi_2Sr_2Ca_{1.5}O_{6.5}$ | 1000 | $Bi_2Sr_2Ca_1Cu_3O_{10}$ | $Bi_2Sr_2Ca_1Cu_2O_8$ | 98 | 1.0 | 80 |
| 3 | $Bi_2Sr_2Ca_2O_7$ | 500 | $Bi_2Sr_2Ca_1Cu_3O_{10}$ | $Bi_2Sr_2Ca_1Cu_2O_8$ | 96 | 0.9 | 79 |
| 4 | $Bi_2Sr_2Ca_2O_6$ | 2000 | $Bi_2Sr_2Ca_2Cu_4O_{12}$ | $Bi_2Sr_2Ca_2Cu_3O_{10}$ | 88 | 1.5 | 103 |
| 5 | $Bi_2Sr_2Ca_{1.5}O_{6.5}$ | 1000 | $Bi_2Sr_2Ca_2Cu_4O_{12}$ | $Bi_2Sr_2Ca_2Cu_3O_{10}$ | 96 | 0.8 | 106 |
| 6 | $Bi_2Sr_2Ca_2O_7$ | 500 | $Bi_2Sr_2Ca_2Cu_4O_{12}$ | $Bi_2Sr_2Ca_2Cu_3O_{10}$ | 94 | 1.1 | 104 |
| COMPARATIVE SUPERCONDUCTIVE THIN FILM-FORMED WAFERS | | | | | | | |
| 1 | — | — | $Bi_2Sr_2Ca_1Cu_3O_{10}$ | $Bi_2Sr_2Ca_1Cu_2O_8$ | 90 | 1.0 | 25 |
| 2 | $Bi_2Sr_2O_5$ | 500 | $Bi_2Sr_2Ca_2Cu_4O_{12}$ | $Bi_2Sr_2Ca_2Cu_3O_{10}$ | 96 | 1.0 | 50 |
| 3 | $Bi_2Sr_2Ca_3O_8$ | 2000 | $Bi_2Sr_2Ca_1Cu_3O_{10}$ | $Bi_2Sr_2Ca_1Cu_2O_8$ | 93 | 1.0 | 50 | for crystalline orientation under an atmosphere containing oxygen at a temperature of 890° C. over 35 hours to obtain a superconductive thin film-formed wafer. In this manner, there were prepared superconductive thin film-formed wafers Nos. 1 to 6 according to the invention and comparative superconductive thin film-formed wafers Nos. 1 to 3.

The comparative superconductive thin film-formed wafer No. 1 does not have an intermediate thin film and Nos. 2 and 3 each contain an intermediate thin film having a composition outside the scope of the present invention.

Then, the critical temperature (Tc) of the superconductive thin films of the superconductive thin film-formed wafers Nos. 1 to 6 of the present invention and the comparative superconductive thin film-formed wafers Nos. 1 to 3 was measured. The results are shown in Table 1.

From the results, it is clear that by virtue of the presence of the intermediate thin film, the superconductive thin films of the superconductive thin film-formed wafers Nos. 1 to 6 according to the invention have higher critical temperatures than the comparative wafer No. 1 which has no intermediate thin film, and the comparative wafers Nos. 2 and 3 which each have an intermediate thin film having a composition outside the scope of the present invention.

EXAMPLE 2

As a substrate, a single-crystal wafer of Si having a diameter of 50.0 mm and a thickness of 0.35 mm was prepared. The substrate was mounted on a conventional sputtering apparatus. Sputtering was carried out by the use of a target for formation of an intermediate thin film, which has a composition shown in Table 2, a diameter of 127 mm and a thickness of 6 mm, under the following conditions:

Radio Frequency Power (13.56 MHz): 200 W
Degree of Vacuum: 20 m torr
Atmosphere: $O_2/(Ar+O_2)=1/5$ (v/v)
Distance between Substrate and Target: 70 mm
Substrate Temperature: 680° C.

Thus, an intermediate thin film having substantially the same composition as the target and an average thickness shown in Table 2 was formed on a surface of the substrate. The resulting wafer was subjected to heat treatment for crystallization by holding same in an infrared oven under a Tl atmosphere at a temperature of 700° C. over 10 minutes, followed by quenching. Then, sputtering was carried out by the use of a target for formation of a superconductive thin film, which has a composition shown in Table 2, a diameter of 127 mm and a thickness of 6 mm, under the following conditions:

Radio Frequency Power (13.56 MHz): 200 W
Degree of Vacuum: 10 m torr
Atmosphere: $O_2/(Ar+O_2)=1/10$ (v/v)
Distance between Substrate and Target: 70 mm
Substrate Temperature: 720° C.

Thus, a superconductive thin film in which the main crystalline phase has a composition, a content, and an average thickness shown in Table 2 was formed on the intermediate thin film. The resulting wafer was further subjected to heat treatment for crystalline orientation by holding same in an infrared oven under a Tl atmo-

TABLE 2

| SPECIMEN | COMPOSITION OF TARGET FOR INTERMEDIATE THIN FILM (ATOMIC RATIO) | AVERAGE THICKNESS OF INTERMEDIATE THIN FILM (Å) | COMPOSITION OF TARGET FOR SUPERCONDUCTIVE THIN FILM (ATOMIC RATIO) | SUPERCONDUCTIVE THIN FILM | | | |
|---|---|---|---|---|---|---|---|
| | | | | COMPOSITION OF MAIN CRYSTALLINE PHASE (ATOMIC RATIO) | CONTENT OF MAIN CRYSTALLINE PHASE (% BY VOLUME) | AVERAGE THICKNESS ($\mu$m) | CRITICAL TEMPERATURE (Tc) |
| SUPERCONDUCTIVE THIN FILM-FORMED WAFERS ACCORDING TO PRESENT INVENTION | | | | | | | |
| 7 | $Tl_1Ba_2Ca_1O_{4.5}$ | 500 | $Tl_1Ba_2Ca_1Cu_3O_8$ | $Tl_1Ba_2Ca_1Cu_2O_7$ | 97 | 1.5 | 72 |
| 8 | $Tl_1Ba_2Ca_{1.5}O_{5.0}$ | 1000 | $Tl_2Ba_2Ca_2Cu_4O_{12}$ | $Tl_2Ba_2Ca_2Cu_3O_{10}$ | 93 | 1.0 | 118 |
| 9 | $Tl_1Ba_2Ca_2O_{5.5}$ | 2000 | $Tl_2Ba_2Ca_1Cu_3O_{10}$ | $Tl_2Ba_2Ca_1Cu_2O_8$ | 95 | 1.3 | 103 |
| 10 | $Tl_2Ba_2Ca_1O_6$ | 1000 | $Tl_1Ba_2Ca_2Cu_4O_{10}$ | $Tl_1Ba_2Ca_2Cu_3O_9$ | 89 | 0.9 | 110 |
| 11 | $Tl_2Ba_2Ca_2O_7$ | 500 | $Tl_1Ba_2Ca_1Cu_3O_8$ | $Tl_1Ba_2Ca_1Cu_2O_7$ | 91 | 1.0 | 73 |
| 12 | $Tl_2Ba_2Ca_3O_8$ | 500 | $Tl_1Ba_2Ca_3Cu_5O_{12}$ | $Tl_1Ba_2Ca_3Cu_4O_{11}$ | 94 | 1.1 | 115 |
| COMPARATIVE SUPERCONDUCTIVE THIN FILM-FORMED WAFERS | | | | | | | |
| 4 | — | 500 | $Tl_2Ba_2Ca_1Cu_3O_{10}$ | $Tl_2Ba_2Ca_1Cu_2O_8$ | 93 | 1.3 | 30 |
| 5 | $Tl_1Ba_2O_{3.5}$ | 500 | $Tl_1Ba_2Ca_1Cu_3O_8$ | $Tl_1Ba_2Ca_1Cu_2O_7$ | 90 | 1.5 | 36 |
| 6 | $Tl_1Ba_2Ca_{2.5}O_6$ | 1000 | $Tl_2Ba_2Ca_1Cu_3O_{10}$ | $Tl_2Ba_2Ca_1Cu_2O_8$ | 92 | 1.0 | 45 |
| 7 | $Tl_2Ba_2Ca_{0.5}O_{5.5}$ | 2000 | $Tl_1Ba_2Ca_2Cu_4O_{10}$ | $Tl_1Ba_2Ca_2Cu_3O_9$ | 96 | 1.0 | 36 |
| 8 | $Tl_2Ba_2Ca_{3.5}O_{7.5}$ | 500 | $Tl_1Ba_2Ca_3Cu_5O_{12}$ | $Tl_1Ba_2Ca_3Cu_4O_{11}$ | 93 | 1.5 | 40 | sphere at a temperature of 900° C. over 30 minutes, followed by quenching, to obtain a superconductive thin film-formed wafer. In this manner, there were prepared superconductive thin film-formed wafers Nos. 7 to 12 according to the invention and comparative superconductive thin film-formed wafers Nos. 4 to 8.

The comparative superconductive thin film-formed wafer No. 4 does not contain an intermediate thin film and Nos. 5 to 8 each contain an intermediate thin film having a composition outside the scope of the present invention.

Then, the critical temperature (Tc) of the superconductive thin films of the superconductive thin film-formed wafers Nos. 7 to 12 of the present invention and the comparative superconductive thin film-formed wafers Nos. 4 to 8 was measured. The results are shown in Table 2.

From the results, it is clear that by virtue of the presence of the intermediate thin film, the superconductive thin films of the superconductive thin film-formed wafers Nos. 7 to 12 according to the invention have higher critical temperatures than the comparative wafer No. 4 which has no intermediate thin film, and the comparative wafers Nos. 5 to 8 which each have an intermediate thin film having a composition outside the scope of the present invention.

As described above, the wafer according to the invention has a superconductive thin film showing a markedly high critical temperature. Therefore, semiconductor devices prepared therefrom can fully satisfy the demand for higher performance and increased wiring density of semiconductor devices.

What is claimed is:

1. A superconductive ceramic thin film containing single-crystal wafer for semiconductor devices comprising
    a single-crystal wafer;
    an intermediate ceramic thin film having a thickness of from 500 to 2000 Å formed on a surface of said single-crystal wafer, said intermediate ceramic thin film comprising as a main phase, a crystalline phase having a composition by atomic ratio of $Bi_2Sr_2Ca_xO_y$ wherein x is 1 to 2 and y is 6 to 7; and
    a superconductive ceramic thin film formed on said intermediate ceramic thin film, said superconductive ceramic thin film comprising as a main phase, a crystalline phase having a composition by atomic ratio selected from the group consisting of $Bi_2Sr_2Ca_1Cu_2O_8$ and $Bi_2Sr_2Ca_2Cu_3O_{10}$.

2. A superconductive ceramic thin film containing single-crystal wafer of claim 1, wherein said single-crystal wafer comprises Si.

3. A superconductive ceramic thin film containing single-crystal wafer of claim 1, wherein said single-crystal wafer comprises Ga—As.

4. A superconductive ceramic thin film containing single-crystal wafer of claim 1, wherein said thin film containing single-crystal wafer has been subjected to heat treatment for crystalline orientation after having said intermediate ceramic thin film and said superconductive ceramic thin film formed in said wafer.

5. A superconductive ceramic thin film containing single-crystal wafer of claim 2, wherein said thin film containing single-crystal wafer has been subjected to heat treatment for crystalline orientation after having said intermediate ceramic thin film and said superconductive ceramic thin film formed in said wafer.

6. A superconductive ceramic thin film containing single-crystal wafer of claim 3, wherein said thin film containing single-crystal wafer has been subjected to heat treatment for crystalline orientation after having said intermediate ceramic thin film and said superconductive ceramic thin film formed in said wafer.

7. A superconductive ceramic thin film containing single-crystal wafer of claim 4, wherein said crystalline orientation is carried out by heat treatment at a temperature of approximately 890° C. for over 35 hours.

8. A superconductive ceramic thin film containing single-crystal wafer of claim 5, wherein said crystalline orientation is carried out by heat treatment at a temperature of approximately 890° C. for over 35 hours.

9. A superconductive ceramic thin film containing single-crystal wafer of claim 6, wherein said crystalline orientation is carried out by heat treatment at a temperature of approximately 890° C. for over 35 hours.

10. A superconductive ceramic thin film-containing single-crystal wafer for semiconductor devices comprising
    a single-crystal wafer;
    an intermediate ceramic thin film having a thickness of from 500 to 2000 Å formed on a surface of said single-crystal wafer said intermediate ceramic thin film comprising as a main phase, a crystalline phase having a composition by atomic ratio selected from the group consisting of
    $Tl_1Ba_2Ca_sO_t$ wherein s is 1 to 2, and t is 4.5 to 5.5 and
    $Tl_2Ba_2Ca_vO_w$ wherein v is 1 to 3, and w is 6 to 8; and
    a superconductive ceramic thin film formed on said intermediate ceramic thin film, said superconductive ceramic thin film comprising, as a main phase, a crystalline phase having a composition by atomic ratio selected from the group consisting of
    $Tl_2Ba_2Ca_1Cu_2O_8$,
    $Tl_2Ba_2Ca_2Cu_3O_{10}$,
    $Tl_1Ba_2Ca_1Cu_2O_7$,
    $Tl_1Ba_2Ca_2Cu_3O_9$, and
    $Tl_1Ba_2Ca_3Cu_4O_{11}$.

11. A superconductive ceramic thin film containing single-crystal wafer of claim 10, wherein said single-crystal wafer comprises Si.

12. A superconductive ceramic thin film containing single-crystal wafer of claim 10, wherein said single-crystal wafer comprises Ga—As.

13. A superconductive ceramic thin film containing single-crystal wafer of claim 10, wherein said thin film containing single-crystal wafer has been subjected to heat treatment for crystalline orientation after having said intermediate ceramic thin film and said superconductive ceramic thin film formed in said wafer.

14. A superconductive ceramic thin film containing single-crystal wafer of claim 11, wherein said thin film containing single-crystal wafer has been subjected to heat treatment for crystalline orientation after having said intermediate ceramic thin film and said superconductive ceramic thin film formed in said wafer.

15. A superconductive ceramic thin film containing single-crystal wafer of claim 12, wherein said thin film containing single-crystal wafer has been subjected to heat treatment for crystalline orientation after having said intermediate ceramic thin film and said superconductive ceramic thin film formed in said wafer.

16. A superconductive ceramic thin film containing single-crystal wafer of claim 13, wherein said crystalline orientation is carried out by heat treatment at a temperature of approximately 900° C. for at least 10 minutes.

17. A superconductive ceramic thin film containing single-crystal wafer of claim 14 wherein said crystalline orientation is carried out by heat treatment at a temperature of approximately 900° C. for at least 10 minutes.

18. A superconductive ceramic thin film containing single-crystal wafer of claim 15, wherein said crystalline orientation is carried out by heat treatment at a temperature of approximately 900° C. for at least 10 minutes.

* * * * *